United States Patent [19]
Ellis

[11] Patent Number: 5,871,884
[45] Date of Patent: *Feb. 16, 1999

[54] ON-DEMAND PRODUCTION OF LAT IMAGING FILMS

[75] Inventor: Ernest W. Ellis, Leverett, Mass.

[73] Assignee: Polaroid Corporation, Cambridge, Mass.

[*] Notice: The term of this patent shall not extend beyond the expiration date of Pat. No. 5,681,681.

[21] Appl. No.: 959,329

[22] Filed: Oct. 28, 1997

Related U.S. Application Data

[62] Division of Ser. No. 475,981, Jun. 7, 1995, Pat. No. 5,681,681, which is a division of Ser. No. 978,482, Nov. 18, 1992, abandoned.

[51] Int. Cl.$^6$ .............................. G03C 7/34; G03G 5/153
[52] U.S. Cl. .......................... 430/201; 430/200; 430/291
[58] Field of Search .................................. 430/200, 201, 430/291, 102, 270.1, 273.1, 275.1, 964, 253

[56] References Cited

U.S. PATENT DOCUMENTS

| | | | |
|---|---|---|---|
| 2,901,374 | 8/1959 | Gundlach | 430/102 |
| 3,060,025 | 10/1962 | Burg et al. | 430/291 |
| 3,450,531 | 6/1969 | Amidon et al. | 430/291 |
| 3,620,726 | 11/1971 | Fu-Hua Chu et al. | 430/291 |
| 3,978,247 | 8/1976 | Braudy et al. | 430/201 |
| 4,456,669 | 6/1984 | Yubakami et al. | 430/201 |
| 4,626,493 | 12/1986 | Butters et al. | 430/201 |
| 4,702,958 | 10/1987 | Itoh et al. | 430/445 |
| 5,156,938 | 10/1992 | Foley et al. | 430/201 |
| 5,171,650 | 12/1992 | Ellis et al. | 430/201 |
| 5,278,023 | 1/1994 | Bills et al. | 430/201 |
| 5,612,165 | 3/1997 | Ellis | 430/201 |
| 5,681,681 | 10/1997 | Ellis | 430/201 |

*Primary Examiner*—Richard L. Schilling
*Attorney, Agent, or Firm*—Louis G. Xiarhos

[57] ABSTRACT

Unique laser ablation transfer ("LAT") imaging films presenting options of flexibility and versatility hitherto alien to this art are produced, on-demand, by toning appropriate substrate as to provide thereon an ablative discontinuous film topcoat comprising a contrast imaging amount of conventional or modified toner particulates.

4 Claims, 5 Drawing Sheets

ON-DEMAND PRODUCTION OF LAT IMAGING FILMS

CROSS REFERENCE TO RELATED APPLICATIONS

This application is a division of my application Ser. No. 08/475,981, filed Jun. 7, 1995 and now U. S. Pat. No. 5,681,681, issued Oct. 28, 1997 for ON-DEMAND PRODUCTION OF LAT IMAGING FILMS, of which application Ser. No. 08/475,981, my now-abandoned application Ser. No. 08/832,691, filed Apr. 11, 1997 is a continuation, and which application Ser. No. 08/475,981, is a division of my now-abandoned application Ser. No. 07/978,482, filed Nov. 18, 1992, of which application Ser. No. 07/978,482, my application Ser. No. 08/470,586, filed Jun. 7, 1997 is a continuation, now U. S. Pat. No. 5,612,165, issued Mar. 18, 1997 for ON-DEMAND PRODUCTION OF LAT IMAGING FILMS.

BACKGROUND OF THE INVENTION

1. Field of the Invention

The present invention relates to the on-demand production of laser ablation transfer ("LAT") imaging films, and, more especially, to the on-demand (or on-line) economical production of LAT imaging films presenting options of flexibility hitherto unknown in laser ablation transfer imaging science ("LATIS").

2. Description of the Prior Art

U. S. Pat. No. 5,156,938 to Diane M. Foley et al, assigned to the assignee hereof and hereby expressly incorporated by reference and relied upon, recounts the LATIS prior art and describes a unique method/system for simultaneously creating and transferring a contrasting pattern of intelligence on and from an ablation-transfer imaging medium to a receptor element in contiguous registration therewith that is not dependent upon contrast imaging materials that must absorb the imaging radiation, typically laser radiation, and is well adopted for such applications as, e.g., color proofing and printing, computer-to-plate, the security coding of various documents and the production of machine-readable or medical items, as well as for the production of masks for the graphic arts and printed circuit industries; the ablation-transfer imaging medium, per se, comprises a support substrate and an imaging radiation-, preferably a laser radiation-ablative topcoat essentially coextensive therewith, such ablative topcoat having a non-imaging ablation sensitizer and an imaging amount of a non-ablation sensitizing contrast imaging material ("CIM") contained therein.

Ellis et al copending application Ser. No. 07/707,039, filed May 29, 1991, also assigned to the assignee hereof and hereby expressly incorporated by reference and relied upon, describes improved ablation-transfer imaging media having greater sensitivity, requiring less sensitizer and threshold energy (thus permitting a greater range of mass to be transferred), and which additionally are kinetically more rapid and facilitate the ablative transfer to a receptor element of an imaging radiation-ablative topcoat containing virtually any type of contrast imaging material (whether sensitizing or non-sensitizing).

Such Ellis et al method/system for simultaneously creating and transferring a contrasting pattern of intelligence on and from a composite ablation-transfer imaging medium to a receptor element in contiguous registration therewith is improvedly radiation sensitive and versatile, is kinetically rapid and not dependent on a sensitized ablative topcoat, and is also very well adopted for such applications as, e.g., color proofing and printing, computer-to-plate, the security coding of various documents and the production of machine-readable or medical items, as well as for the production of masks for the graphic arts and printed circuit industries; the Ellis et al composite ablation-transfer imaging medium, per se, comprises a support substrate (i), at least one intermediate "dynamic release layer" (ii) essentially coextensive therewith and an imaging radiation-ablative carrier topcoat (iii) also essentially coextensive therewith, said imaging radiation-ablative carrier topcoat (iii) including an imaging amount of a contrast imaging material contained therein, whether or not itself including a laser absorber/sensitizer, and said at least one dynamic release layer (ii) absorbing such imaging radiation, typically laser radiation, at a rate sufficient to effect the imagewise ablation mass transfer of at least said carrier topcoat (iii).

By "dynamic release layer" is intended an intermediate layer that must interact with the imaging radiation to effect imagewise ablative transfer of at least the carrier topcoat onto a receptor element at an energy/fluence less than would be required in the absence thereof. The dynamic release layer ("DRL") is believed to release the carrier topcoat by effectively eliminating the adhesive forces that bond or consolidate the carrier topcoat with the support substrate. Preferably, under the same conditions additional propulsion is simultaneously provided by the interaction of the imaging radiation therewith, e.g., by ablation of the dynamic release layer itself, thus further facilitating the imagewise ablative transfer of the entire carrier topcoat to a receptor element. Representative DRLs per Ellis et al include metal, metal alloy, metal oxide and metal sulfide thin films, etc., and the organics.

Nonetheless, to data the LAT imaging films employed in, for example, the Foley et al and Ellis et al LATIS' described above have been limited to those "permanent" films available from inventory, namely, pre-manufactured or pre-coated, and, thus, which inventory is typically inadequate to supply the complete spectrum of LAT imaging films that may be required for a particular application, e.g., not all colors, not all color densities, not all film thicknesses, etc., are usually available from inventory.

SUMMARY OF THE INVENTION

Accordingly, a major object of the present invention is the provision of unique means for the on-demand or on-line production or generation, of LATIS imaging films that offers the end user a degree of flexibility and versatility hitherto alien to this art.

Another object of this invention is the on-demand production/generation of LAT imaging films having any one or more of an essentially infinite number of contrast imaging material options, as well any one or more of an essentially infinite number of thicknesses and CIM densities.

Yet another object of the present invention is the provision of unique means for the on-demand production/generation of LATIS imaging films which entails conventional toning techniques utilizing conventional liquid or dry toners, or liquid or dry toners especially modified or customized as to be tailored to a specific desire or LATIS application.

Still another object of this invention is the provision of such unique means employing conventional or customized toners that presents the option, whether from an economic and/or environmental standpoint, of recycling the unused toner from the non-imaged areas on imaged donor films.

And still another object of this invention is the provision of composite LAT imaging films comprising a discontinuous or "toned" ablative topcoat and, hence, that are improvedly laser radiation sensitive (by reason of the reduced adhesion of the discontinuous ablative topcoat to whatever substrate, whether or not including a DRL, in contradistinction to LAT imaging films which comprise a permanent, durably adhered continuous ablative topcoat).

Briefly, the present invention features the on-demand supply of appropriate substrate that will ultimately comprise the desired LAT film, and then on-site toning such substrate as to provide a unique composite film having a desired color or imaging functionality at a desired thickness or density, typically just prior to or immediately upstream of the actual imaging sequence.

DETAILED DESCRIPTION OF THE PREFERRED EMBODIMENTS OF THE INVENTION

More particularly according to the present invention, it will be immediately apparent that the subject "toning" or "toner" technique eliminates the requirement for manufactured (pre-coated) donor imaging sheets (films) and permits the end user much greater flexibility in imaging, e.g., in respect of required colors and densities, to meet any particular industry standard, whether United States, for example ANPA (American Newspaper Publishers' Association) and SWOP (Standards For Web Offset Publication), European, Japanese, etc.

By "toning" or "toner" technique is intended that a discontinuous film or coating is provided via any conventional means for applying toner particulates to a substrate, as opposed to, e.g., solvent coated continuous phase films. Such "toning" enhances the laser radiation sensitivity of the final product LAT film as a consequence of the lesser adhesive and cohesive forces bonding the imaging layer topcoat onto its supporting substrate.

It will thus be appreciated that conventional toning techniques are utilized per the present invention for the on-demand production of LAT imaging media that functionally and structurally correspond to those described in the aforesaid Foley et al '938 patent and Ellis et al '039 copending application (hereinafter simply "Foley et al/Ellis et al"). The toners, per se, may be either conventional liquid or dry toners, or liquid or dry toners especially modified or customized as to be tailored to a specific LATIS application. Such toners, moreover, may either include or not include a laser absorber/sensitizer, albeit if a LAT imaging medium is to be produced corresponding to one described in Foley et al, the toner necessarily is or comprises an ablation sensitizer, with the toner particles themselves comprising the imaging amount of the contrast imaging material, characteristically the imaging amount of a non-ablation sensitizing contrast imaging material. Too, the toner may reflect a high pigment to binder ratio, wherefrom the highest density prints can be obtained. Stated differently, the pigment to binder ratio is advantageously optimized for greatest sensitivity and color density. Also advantageously, the toner pigments are the same as the conventional printing ink pigments for proofing applications, and the binders should be selected as a function of the intended final application (for example ink receptive and durable materials for printing plates or easily fusible materials for paper receptor applications). The particle size of the toner pigments is likewise dependent on the desired final application. "Prolonged tacky toners", as described in U.S. Pat. No. 4,461,823, are also envisaged, as are the toning methods described in U.S. Pat. Nos. 3,060,026 and 4,019, 821 and in Held, *Journal of Imaging Technology*, 17, No. 1, pp. 18–21 (February/March 1991).

It will also be appreciated that toned LAT imaging media present a number of distinct advantages versus the "permanent" or manufactured (pre-coated) variety. Notably, the toned LAT imaging media according to this invention manifest improved laser sensitivity by reason of the decreased adhesion of the toner to the support substrate therefor and the diminished cohesive forces because no continuous film is required to be disintegrated/ablated. Further, any desired thickness and/or density of the toned ablative topcoat is readily provided by simple adjustment of the magnitude of charging and/or changing the duration of the dwell time that the toner is in contact with the support substrate to be toned. The economics of the respective systems should also be considered, namely, the economics of a toner system compare quite favorably vis-a-vis solvent coating that produces a permanent continuous film. Likewise as regards environmental concerns, since the evolution of volatile organic compounds ("VOCs") is far more problematical in solvent coating contexts. And per the present invention the "unused" toner remaining on the film subsequent to the imaging sequence is easily recycled by simple stripping; the support substrate, e.g., a polyester base, can also be recycled in the usual manner. Equally as important, though, is the fact that on-demand production of LAT imaging films eliminates the requirement for an inventory of many thicknesses and/or densities of contrast imaging materials, makes more colors available, and offers the end user cost savings and that degree of flexibility and versatility indicated above hitherto alien to this art.

Moreover, the possibility exists that the investment in the toning hardware may be offset by decreased costs in the write engine laser, i.e., laser expenses may be reduced because of the greater sensitivity of toned LAT donor elements, namely, Diode Pumped Solid State lasers may be replaced by far less expensive semiconductor lasers not requiring modulators. The "time-to-tone" may similarly be offset by reason of the more rapid write times allowed by more sensitive LAT imaging media.

In one preferred embodiment of the invention, the LAT donor films are formed "on-demand" by charging a metallized laser-transparent and laser-sensitive substrate, for example a support substrate coated with a thin metal film dynamic release layer ("DRL") as described in said copending Ellis et al '039 application, and then subjecting the charged substrate to liquid or dry toner treatment to provide a composite film having a desired color or imaging functionality at a desired thickness or density just prior to imaging.

The toning treatment is per se known to this art and characteristically entails a direct charging by applying a potential to the ground plane, e.g., of a metallized polyester film, or indirectly as by corona discharge.

These LAT donor films are subsequently biased in registration with a receptor element, preferably in a vacuum, on an external drum, inside a stationary internal drum or on a flatbed laser imaging device. Laser ablation transfer imaging is then accomplished by the imagewise modulation of a scanned laser beam through appropriate optical components onto the donor/receptor composite. After imaging is complete the donor is separated from the receptor element revealing both a registered positive and a negative image. The transfer process may be repeated sequentially with other donor colorants to the same receptor to produce a multicolor, registered image, e.g., a direct digital color proof or print.

In this process unused toners or unimaged areas may be recovered for future use, an economical and environmental benefit.

In another preferred embodiment, the LAT donor films of this invention can be formed by blanketwise ultraviolet exposure of a photosensitive polymeric coating on the metal side of a laser-sensitive metallized laser-transparent base substrate producing a tacky surface useful for dry toning with contrast imaging materials, laser sensitized or unsensitized. LAT imaging may be accomplished by biasing the thus generated donor element into intimate contact with a suitable receptor element on or within an imaging drum or flatbed and imagewise laser scanning. After imaging is complete the two elements are separated to reveal a registered positive and a negative image.

Suitable support substrates per this invention are those described in Foley et al/Ellis et al, namely, a glass, polyester, polycarbonate, polyurethane, polyolefin, polyamide, polysulfone, polystyrene, cellulosic, etc. Likewise as regards the receptor element, i.e., newsprint, paper, plastic, film, metal, fabric, etc., as well as the contrast imaging material, i.e., colorant, ultraviolet or infrared absorbing material, magnetic material, polymeric material, fluorescent material, conducting material, etc.

Figure 1:
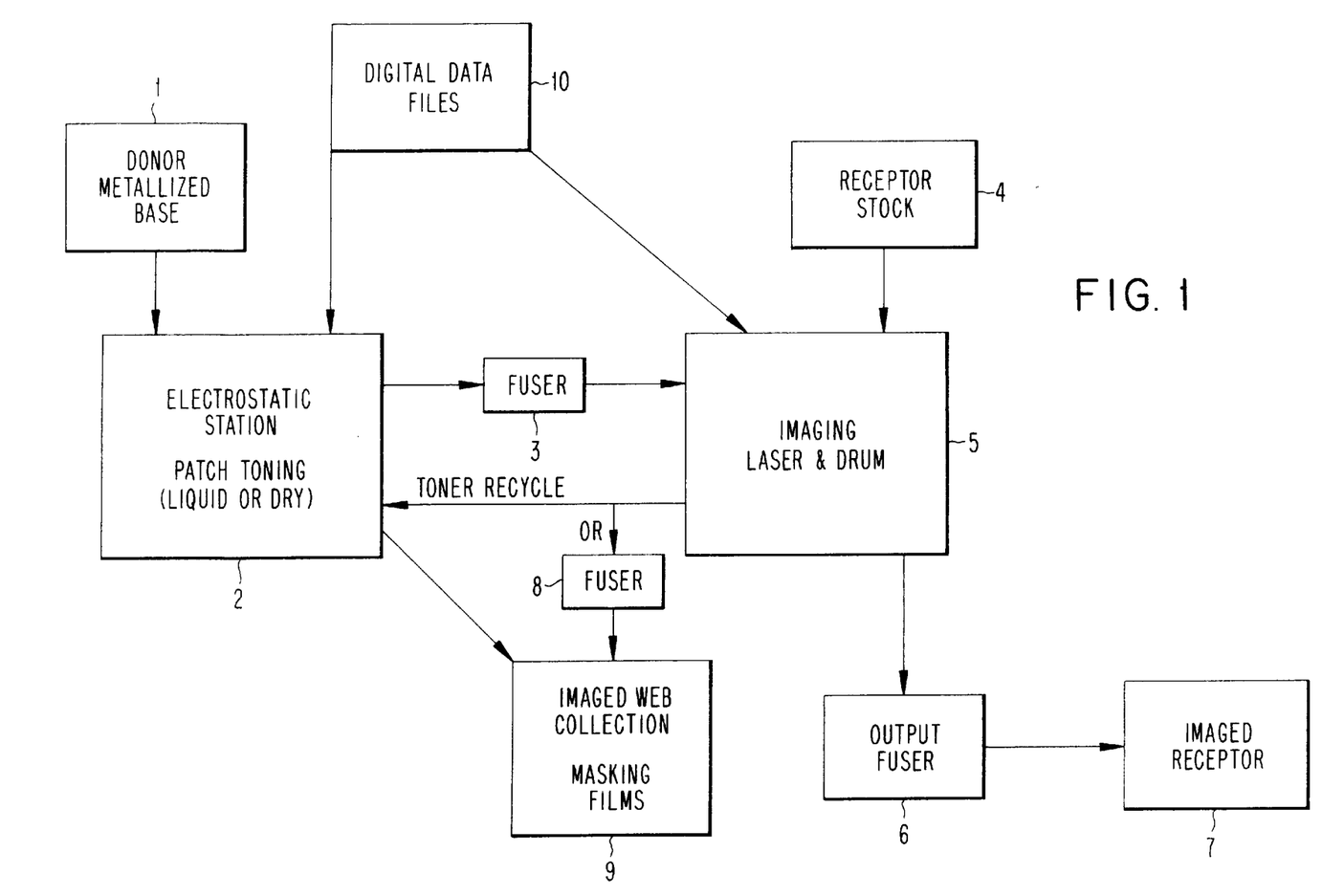
FIG. 1 is a block diagram/schematic of one embodiment of on-demand production and immediate downstream imaging of unique LAT imaging films according to the present invention.

Referring specifically to the Figures of Drawing, FIG. 1 is a block diagram depicting one embodiment of on-demand production of LAT imaging films according to the present invention via electrostatic toning technique, as well as the downstream imaging thereof and ultimate provision of appropriately imaged receptor element. Thus, appropriate substrate, e.g., a metallized polyester base, is transferred from donor supply 1 to an electrostatic station 2 whereat said metallized base is electrically charged (for example directly, by applying a potential to the ground plane of the metallized polyester, or indirectly, by corona discharge) and then is toned in conventional manner with either a liquid or dry toner, such toner either being conventional and commercially available or being especially modified or customized, as indicated above, as to be tailored for a particular LATIS application. The composite imaging film is next advanced through an optional fusing or stabilizing station 3 (with stabilization being tantamount to a partial fusing to enhance the durability thereof) and ultimately is biased in registration with preselected receptor element, indexed from receptor stock supply 4, in a laser imaging device 5. After imaging has been completed, the donor imaging film is separated from the imaged receptor element providing both a registered positive and negative image. The imaged receptor element, for certain applications, is transferred through an output fuser 6 to securely affix the imaging coating to the receptor element indicated by the reference numeral 7.

The "spent" film can then be processed, as shown, to recover and recycle the untransferred toner therefrom to said electrostatic station 2, or, if desired, the remaining image can be fused, at station 8, to provide, e.g., a masking film or the like, recovered at site 9. It is also within the scope of the present invention that either or both of the toning/imaging operations can be computer or numerically controlled by input of predetermined data from appropriate digital data files 10.

Figure 2A:
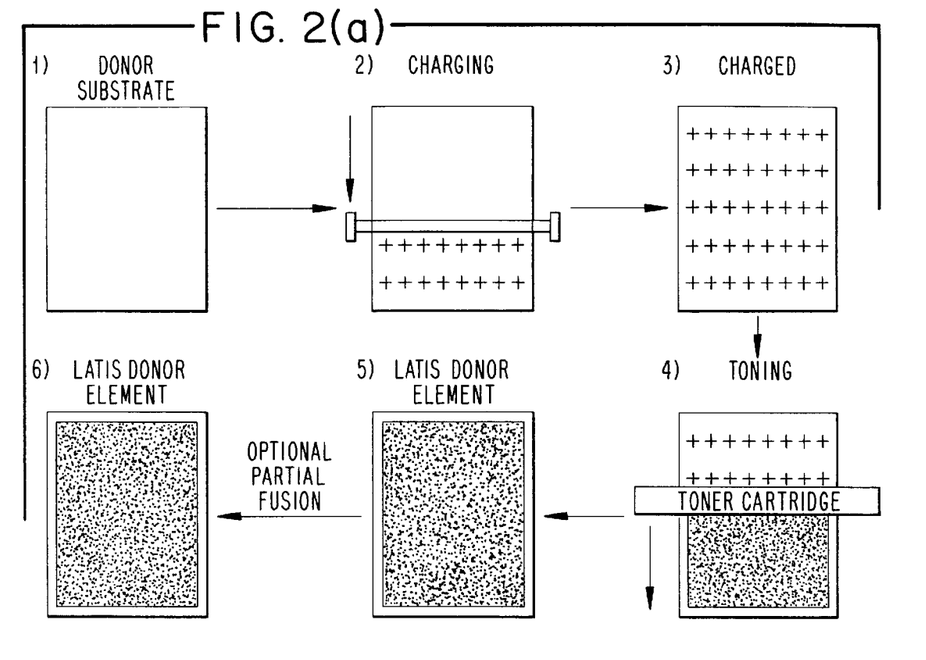
FIGS. 2(a) and 2(b) are diagrammatic/schematic representations of two embodiments of on-demand production of unique LAT imaging films per the present invention.

FIG. 2(a) illustrates in greater detail the charging/toning sequence conducted in the electrostatic station or module 2 shown in FIG. 1, employing, for example, an aluminized (DRL) polyester substrate as described in the aforesaid Ellis et al '039 application.

Figure 3:
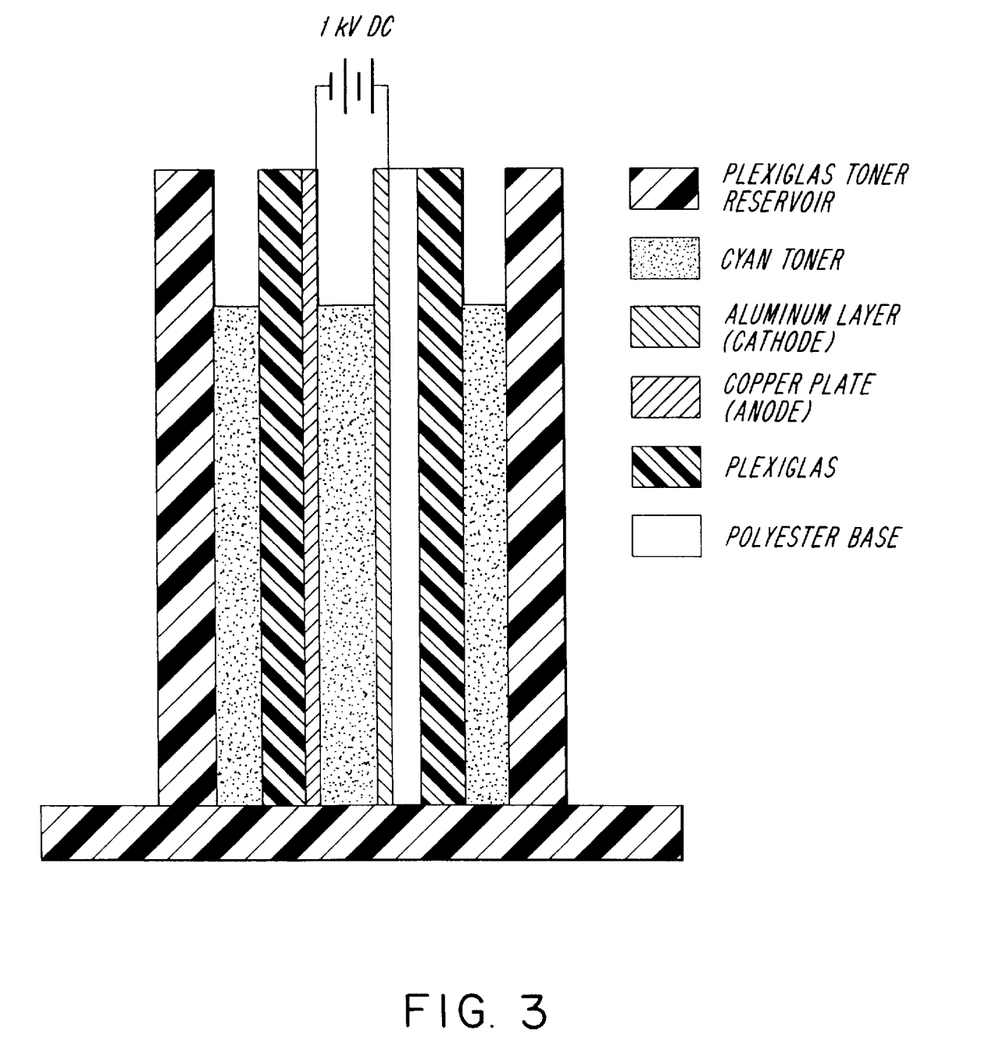
FIG. 3 is a cross-sectional plan view of particular toner apparatus for on-demand producing the unique LAT imaging films of this invention.

The apparatus for the toning operation conducted in said electrostatic station 2 is shown in greater detail in FIG. 3, using cyan as a representative toner.

Figure 2B:
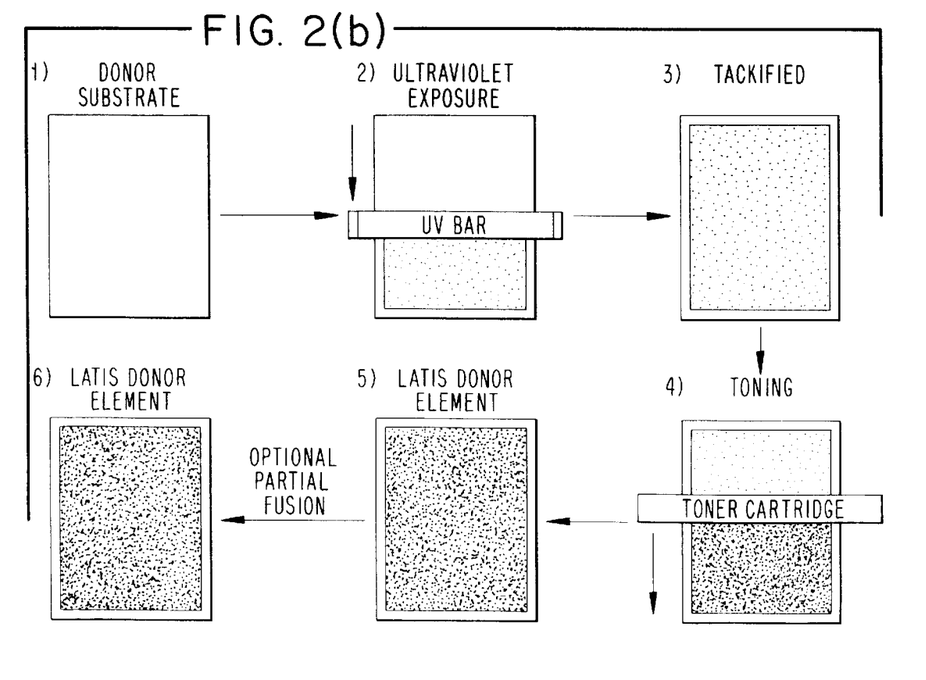
Figure 4:
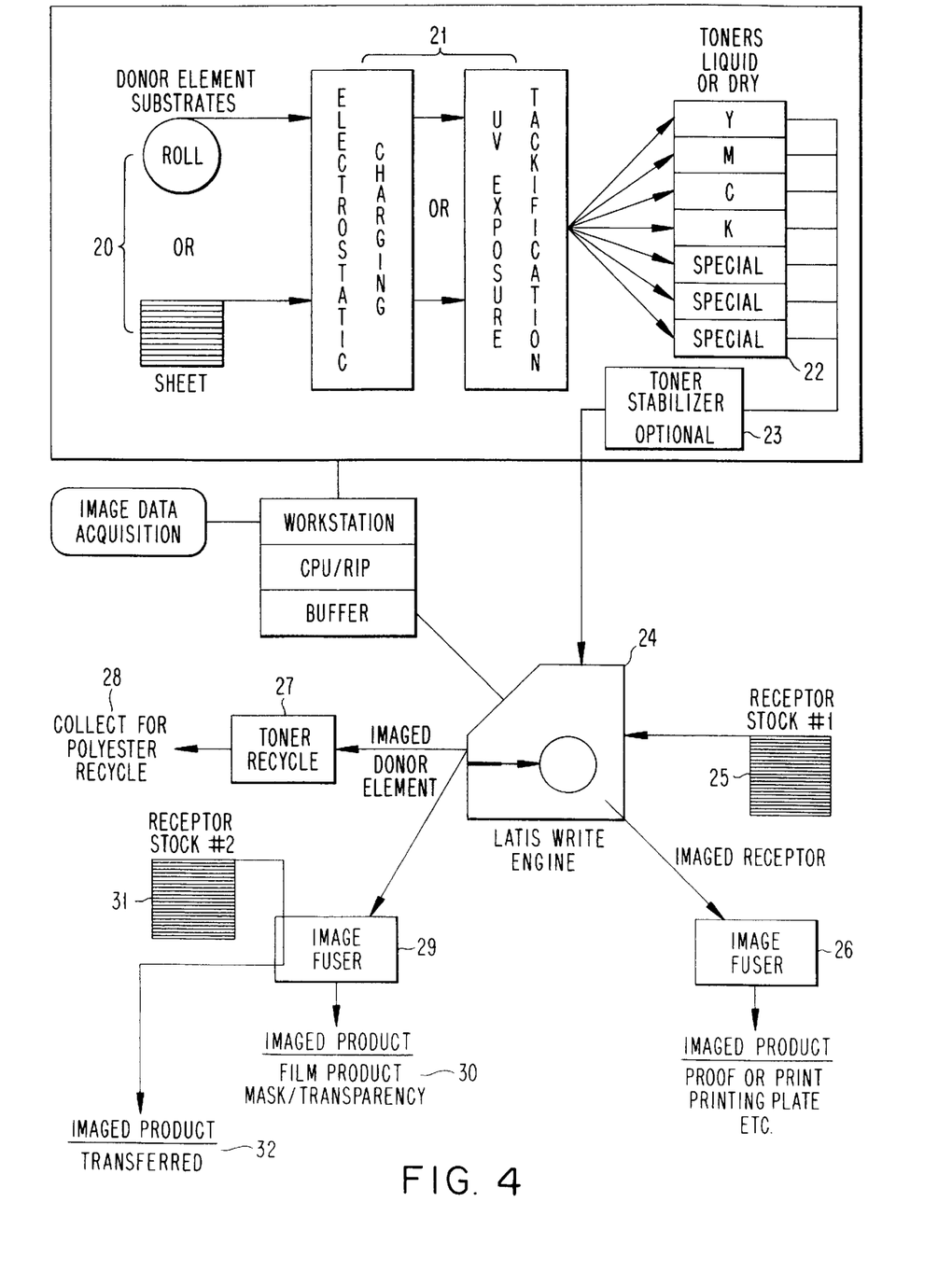
FIG. 4 is a block diagram/schematic of another embodiment of on-demand production and immediate downstream imaging of LAT imaging films according to the present invention.

FIG. 4 is a block diagram depicting a computer controlled or otherwise automated system for on-demand production of LAT imaging films according to this invention either via electrostatic or "tacky surface" toning technique, as well as the downstream imaging of the toned substrate and ultimate production of appropriately imaged receptor element. In this embodiment appropriate substrate, e.g., a metallized polyester base or a metallized polyester base coated with a photosensitive polymer on the metal side thereof, whether in sheet or in roll form, is controlledly transferred from the donor supply 20 to a conditioning station 21 whereat said metallized base is either electrically charged (as in the embodiment shown in FIGS. 1 and 2(a)) or the photosensitive polymeric coating is blanketwise ultraviolet exposed to produce a tacky surface susceptible to dry toning, as is well known to this art (shown in greater detail in FIG. 2(b)).

The conditioned substrate is next advanced to an automated toning station 22 and predetermined amount of suitable toner, whether liquid or dry, is uniformly applied thereto over the entirety of the conditioned face surface of the substrate. The toner may be, for example, a conventional yellow (Y), magenta (M), cyan (C) or black (K) toner, or may be of the customized type as hereinbefore discussed, indicated as "special." The resulting composite imaging film is then controlledly transported, after being cut into sheet form if originally supplied from a roll and, as in the embodiment of FIG. 1, optionally after fusing the toner to the donor substrate at station 23 for purposes of durability or avoiding the damaging effects of "handling", to a laser imaging device 24. In said laser imaging device 24 the composite imaging film is automatically controlledly biased in registration with a preselected receptor element supplied from "inventory" 25 and therein imagewise laser irradiating said composite imaging film by means of appropriate LAT write engine to a predetermined pattern of intelligence with an intensity sufficient to effect the ablation mass transfer of the volume of the imagewise-exposed area of the laser radiation-ablative topcoat of said film onto said receptor element. After the imaging sequence has been completed, the donor imaging film is controlledly separated from the imaged receptor element to respectively provide both positive and negative images. The imaged receptor element, for certain applications optionally after transfer through an output fuser 26 to more securely affix the imaging coating to the receptor element, is thence recovered as product, for example proof or print, printing plate, medical image, etc., as described in the aforesaid Foley et al/Ellis et al patent/pending application.

Also essentially as in FIG. 1, the "spent" film or imaged donor element can then be processed to recover and recycle the untransferred toner therefrom, via toner recycle station 27, to said toner station 22, as well as to recover and recycle the polyester substrate, via polyester recycle station 28. Alternatively, the image remaining on the composite film can be fused, at station 29, to provide, e.g., a masking film product, etc., recovered at site 30. Also alternatively, the imaged film can be biased in registration with another receptor element 31 and the unimaged topcoat remaining thereon can be transferred to said receptor element 31 and advantageously fused thereto to provide the imaged product 32.

Figure 5:
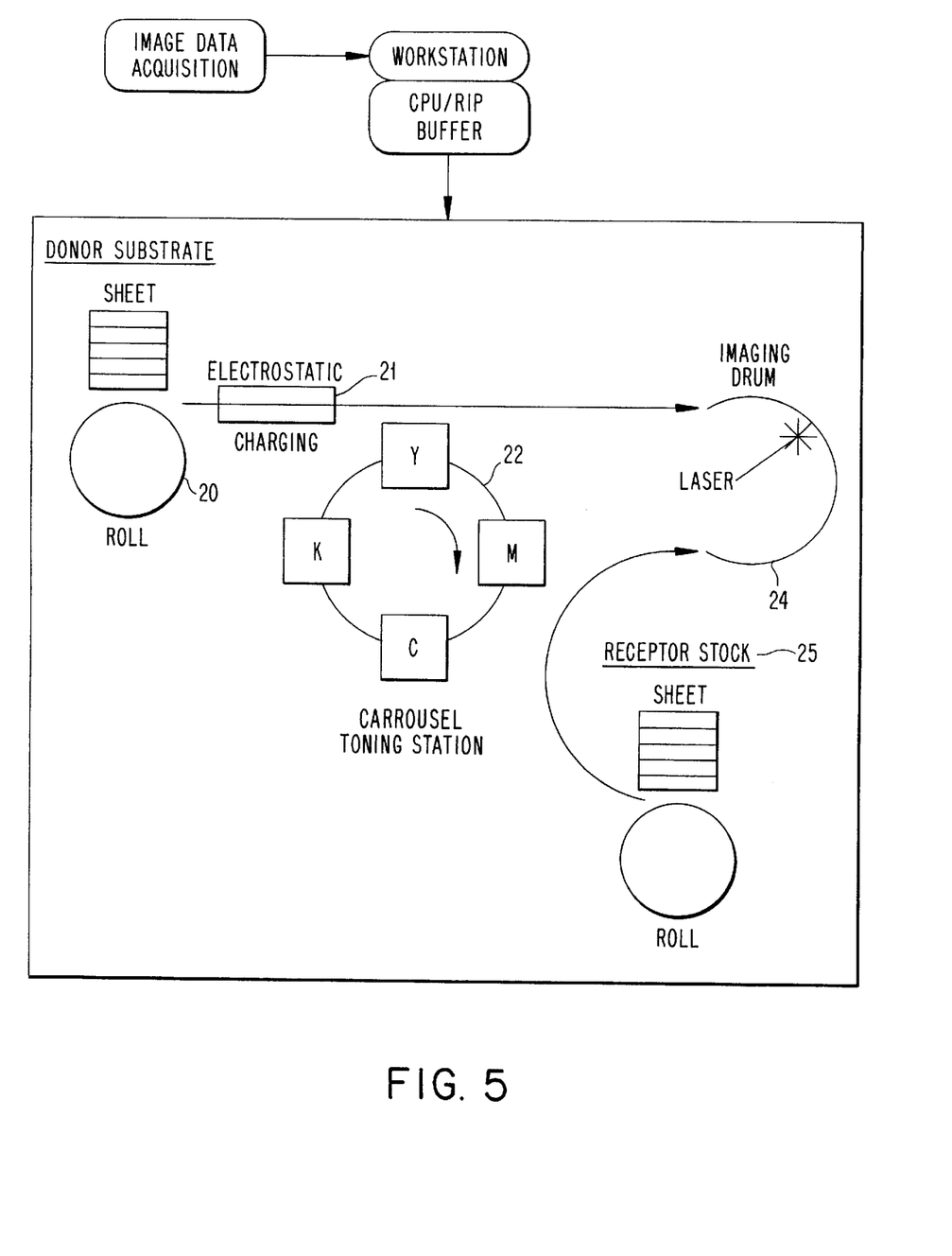
FIG. 5 is another block diagram/schematic of a computer controlled system for the on-demand production and downstream imaging of LAT imaging films according to the present invention.

FIG. 5 is a block diagram depicting another computer controlled or CPU system (or Raster image processor - "RIP") for on-demand production of LAT imaging films per the present invention through the imaging sequence in the laser imaging device 24. In this instance, the metallized polyester base is provided in roll form from the donor supply 20, is electrostatically charged in the conditioning station 21 and is next advanced to a specialized toner station 22. Such specialized toner station 22 comprises a carousel of different colorant toners, e.g., yellow (Y), magenta (M), cyan (C) and black (K). Depending upon the particular data input, the carousel is automatically indexed to the particular color (toner) desired to be uniformly applied over the entirety of the oppositely charged face surface of the substrate. The toner cartridge carousel provides a means for automated deposition of selected colors and sequence when a roll fed donor substrate is employed. Sheet fed operation may be accomplished via multiple sheet/charging/toning stations configured to deliver donor elements to the write engine.

It too will be appreciated that LAT imaging films having an absorption band in a region of the near infrared spectrum, as described in Foley et al/Ellis et al, are also hereby provided.

Lastly, while the present invention has been described in terms such as "on-demand" or "on-line", it will be apparent that the subject LAT imaging films produced by toning appropriate substrate need not necessarily be contemporaneously or immediately imaged; rather, such toned films may themselves be stored in inventory until later time—at least in this event the ablative topcoats thereof are advantageously at least partially fused or stabilized as a safeguard against damage that may be occasioned by handling or storage.

In order to illustrate the present invention and the advantages thereof, the following specific examples are given, it being understood that same are intended only as illustrative and in nowise limitative.

EXAMPLE 1

Production of toned donor elements

A 3.6 mil sheet of polyester (ICI-505), one side of which comprised a 30 Å vacuum deposited layer of aluminum, was placed into a reservoir of commercial liquid cyan toner (supplied by Hewlett Packard). Specific substrate toner densities were achieved by maintaining a 1 kV DC potential difference between the aluminum layer, serving as the cathode, and a parallel copper plate anode for various periods of time (10 to 45 seconds). The toned donor element was subsequently removed from the toner bath and air dried.

This process was repeated with magenta, yellow and black toners to produce the other three donor elements required to ultimately produce a full color laser ablation transfer image on a receptor element.

EXAMPLE 2

Laser ablation transfer imaging

The LAT imaging process was carried out using a Crosfield Datrax 765 Facsimile System. The write engine in this system employed a 16 watt Nd:YAG laser (emitting at 1064 nm) to provide the imaging radiation (ca. 6–8 watts at the film plane for a 25 micron diameter spot). The toned donor sheets were sequentially placed toner side against a paper receptor sheet mounted on the Datrax image transport truck. Laser writing was accomplished at 8 watts (at film plane) and 1200 lines per inch with the donor and the receptor held together in a vacuum (ca. 26 in. Hg).

Color separated digital image data files, matched with the various toner colors, were sequentially used to modulate the laser writing to ultimately produce a full color image on a common paper receptor sheet.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including equivalents thereof.

What is claimed is:

1. A method for transferring a contrasting pattern of intelligence from a composite LAT imaging film to a receptor element in contiguous registration therewith, said composite LAT imaging film comprising a support substrate having, in order, a dynamic release layer comprising a metal thin film, and a laser radiation-ablative, discontinuous film topcoat essentially coextensive therewith, said dynamic release layer being interactive with laser imaging radiation to effect imagewise ablative transfer of at least said discontinuous film topcoat onto said receptor element at an energy/fluence less than would be required in the absence thereof, said discontinuous film ablative topcoat comprising a contrast imaging amount of toner particulates applied to the surface of said dynamic release layer by electrostatic charging, said method comprising the step of imagewise laser-irradiating said composite LAT imaging film according to said pattern of intelligence with an intensity sufficient to effect the ablation mass transfer of the volume of the imagewise-exposed area of the laser radiation-ablative, discontinuous film topcoat of said composite LAT imaging film onto said receptor element and whereby said transferred topcoat delineates said pattern of intelligence.

2. A method for transferring a contrasting pattern of intelligence from a composite LAT imaging film to a receptor element in contiguous registration therewith, said composite LAT imaging film comprising a support substrate having, in order, a dynamic release layer comprising a metal thin film, and a laser radiation-ablative, discontinuous film topcoat essentially coextensive therewith, said dynamic release layer being interactive with laser imaging radiation to effect imagewise ablative transfer of at least said discontinuous film topcoat onto said receptor element at an energy/fluence less than would be required in the absence thereof, said discontinuous film ablative topcoat comprising a contrast imaging amount of toner particulates, said toner particulates being applied to the surface of said dynamic release layer by electrostatic charging, said method comprising the steps of on-demand toning said dynamic release layer on said support substrate to provide thereon said laser-ablative discontinuous film topcoat, contemporaneously indexing the imaging film thus produced into registration with said receptor element and contemporaneously then imagewise laser-irradiating said composite LAT imaging film according to said pattern of intelligence with an intensity sufficient to effect the ablation mass transfer of the volume of the imagewise-exposed area of the laser radiation-ablative discontinuous film topcoat of said composite LAT imaging film onto said receptor element and whereby said transferred topcoat delineates said pattern of intelligence thereon.

3. A method for transferring a contrasting pattern of intelligence from a composite LAT imaging film to a receptor element in contiguous registration therewith, said composite LAT imaging film comprising a support substrate having, in order, a dynamic release layer comprising a metal thin film, and a laser radiation-ablative, discontinuous film topcoat essentially coextensive therewith, said dynamic release layer being interactive with laser imaging radiation to effect imagewise ablative transfer of at least said discontinuous film topcoat onto said receptor element at an energy/fluence less than would be required in the absence thereof, said discontinuous film ablative topcoat comprising a contrast imaging amount of toner particulates applied by dry toning to a tacky surface provided over said metal thin layer by blanketwise ultraviolet exposure of a polymeric coating applied to said metal thin layer, said method comprising the step of imagewise laser-irradiating said composite LAT imaging film according to said pattern of intelligence with an intensity sufficient to effect the ablation mass transfer of the volume of the imagewise-exposed area of the laser radiation-ablative, discontinuous film topcoat of said composite LAT imaging film onto said receptor element and whereby said transferred topcoat delineates said pattern of intelligence.

4. A method for transferring a contrasting pattern of intelligence from a composite LAT imaging film to a receptor element in contiguous registration therewith, said composite LAT imaging film comprising a support substrate having in order, a dynamic release layer comprising a metal thin film, and a laser radiation-ablative, discontinuous film topcoat essentially coextensive therewith, said dynamic release layer being interactive with laser imaging radiation to effect imagewise ablative transfer of at least said discontinuous film topcoat onto said receptor element at an energy/fluence less than would be required in the absence thereof, said discontinuous film ablative topcoat comprising a contrast imaging amount of toner particulates, said toner particulates of said discontinuous film topcoat being applied by dry toning to a tacky surface provided over said metal thin layer by blanketwise ultraviolet exposure of a polymeric coating applied to said metal thin layer, said method comprising the steps of on-demand toning said dynamic release layer on said support substrate to provide thereon said laser-ablative discontinuous film topcoat, contemporaneously indexing the imaging film thus produced into registration with said receptor element and contemporaneously then imagewise laser-irradiating said composite LAT imaging film according to said pattern of intelligence with an intensity sufficient to effect the ablation mass transfer of the volume of the imagewise-exposed area of the laser radiation-ablative discontinuous film topcoat of said composite LAT imaging film onto said receptor element and whereby said transferred topcoat delineates said pattern of intelligence thereon.

* * * * *